United States Patent [19]
McDunn et al.

[11] Patent Number: 5,831,824
[45] Date of Patent: Nov. 3, 1998

[54] APPARATUS FOR SPRAY-COOLING MULTIPLE ELECTRONIC MODULES

[75] Inventors: Kevin J. McDunn, Lake in the Hills; Linda Limper-Brenner, Glenview; Minoo D. Press, Schaumburg, all of Ill.

[73] Assignee: Motorola, Inc., Schaumburg, Ill.

[21] Appl. No.: 594,212

[22] Filed: Jan. 31, 1996

[51] Int. Cl.$^6$ .................................................... H05K 7/20
[52] U.S. Cl. ............................................................ 361/699
[58] Field of Search ............................ 165/104.33, 80.4; 361/687–689, 698–703, 752, 785, 796

[56] References Cited

U.S. PATENT DOCUMENTS

| | | |
|---|---|---|
| 3,725,566 | 4/1973 | Plizak . |
| 4,399,484 | 8/1983 | Mayer . |
| 4,542,076 | 9/1985 | Bednarz et al. . |
| 4,706,164 | 11/1987 | L'Henaff et al. . |
| 4,711,431 | 12/1987 | Viannay et al. . |
| 4,847,731 | 7/1989 | Smolley . |
| 4,854,377 | 8/1989 | Komoto et al. . |
| 4,884,167 | 11/1989 | Mine . |
| 4,912,600 | 3/1990 | Jaeger et al. ........................ 361/699 |
| 4,935,864 | 6/1990 | Schmidt et al. . |
| 4,945,980 | 8/1990 | Umezawa . |
| 4,964,019 | 10/1990 | Belanger, Jr. . |
| 5,014,777 | 5/1991 | Sano . |
| 5,050,037 | 9/1991 | Yamamoto et al. . |
| 5,057,968 | 10/1991 | Morrison . |
| 5,131,233 | 7/1992 | Cray et al. . |
| 5,166,863 | 11/1992 | Shmunis . |
| 5,174,364 | 12/1992 | Mizuno . |
| 5,175,395 | 12/1992 | Moore . |
| 5,177,666 | 1/1993 | Bland et al. . |
| 5,190,099 | 3/1993 | Mon . |
| 5,210,440 | 5/1993 | Long . |

(List continued on next page.)

FOREIGN PATENT DOCUMENTS 0091733  10/1983  European Pat. Off. ............... 361/689

OTHER PUBLICATIONS

M. Ghodbane et al., "Experimental Study of Spray Cooling with Freon–113", Int. J. Heat Mass Transfer, vol. 34, No. 4/5, pp. 1163–1174 (1991).

J.P. Holman et al., "Extended Studies of Spray Cooling with Freon–113", Int. J. Heat Mass Transfer, vol. 36, No. 8, pp. 2239–2241 (1992).

Donald E. Tilton et al., "High–Flux Spray Cooling in a Simulated Multichip Module", HTD–vol. 206.2, Topics in Heat Transfer–vol. 2, ASME (1992).

S.K. Chen et al., "Factors Influencing the Effective Spray Cone Angle of Pressure–Swirl Atomizers", Journal of Engineering for Gas Turbines and Power, vol. 114, pp. 97–103 (Jan. 1992).

Donald Tilton et al., "Advanced Thermal Management for Multichip Modules", Electronic Packaging and Production, pp. 71–73 (Aug. 1995).

Kurt A. Estes et al., "Comparison of Two–Phase Electronic Cooling Using Free Jets and Sprays", Journal of Electronic Packaging, vol. 117, pp. 323–332 (Dec. 1995).

Kurt A. Estes et al., "Correlation of Sauter Mean Diameter and Critical Heat Flux for Spray Cooling of Small Surfaces", Int. J. Heat Mass Transfer, vol. 38, No. 16, pp. 2985–2996 (1995).

*Primary Examiner*—Gregory D. Thompson
*Attorney, Agent, or Firm*—Heather L. Creps

[57] ABSTRACT

The apparatus includes a substantially planar plate having a first side and a second side. A plurality of substantially planar fluid distributing manifolds are formed in the first side of the plate, each fluid distributing manifold having a surface recessed relative to at least a portion of the first side of the plate. A nozzle housing is located in the surface of each fluid distributing manifold. The nozzle housing is adapted to receive a nozzle and has a receptacle end and a spray end. The spray end has an aperture, and is in communication with the second side of the plate. The receptacle end is in communication with the surface of one of the plurality of fluid distributing manifolds.

21 Claims, 3 Drawing Sheets

U.S. PATENT DOCUMENTS

| | | |
|---|---|---|
| 5,220,804 | 6/1993 | Tilton et al. . |
| 5,232,164 | 8/1993 | Resch et al. . |
| 5,256,833 | 10/1993 | Schwenk . |
| 5,264,984 | 11/1993 | Akamatsu . |
| 5,285,351 | 2/1994 | Ikeda . |
| 5,289,363 | 2/1994 | Ferchau et al. . |
| 5,329,419 | 7/1994 | Umezawa . |
| 5,348,076 | 9/1994 | Asakawa . |
| 5,360,993 | 11/1994 | Mine . |
| 5,384,687 | 1/1995 | Sano . |
| 5,388,030 | 2/1995 | Gasser et al. . |
| 5,431,974 | 7/1995 | Pierce . |
| 5,436,501 | 7/1995 | Ikeda . |
| 5,436,793 | 7/1995 | Sanwo et al. . |
| 5,463,528 | 10/1995 | Umezawa . |
| 5,483,423 | 1/1996 | Lewis et al. . |
| 5,491,363 | 2/1996 | Yoshikawa . |

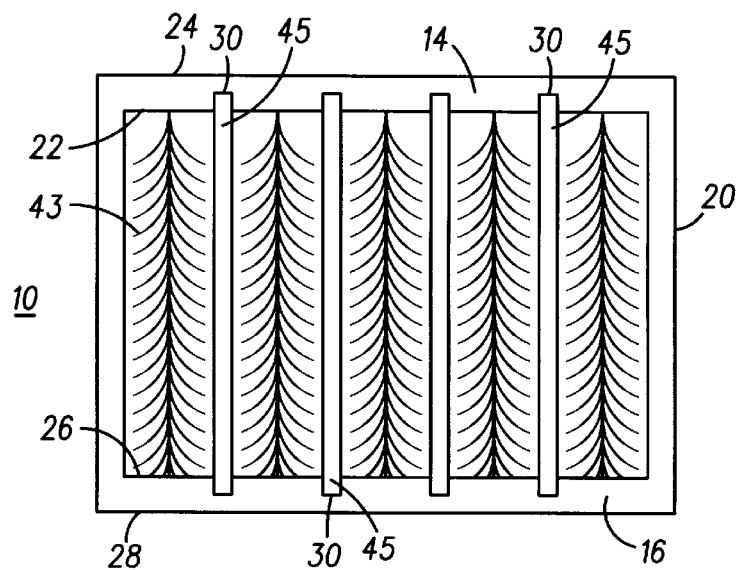
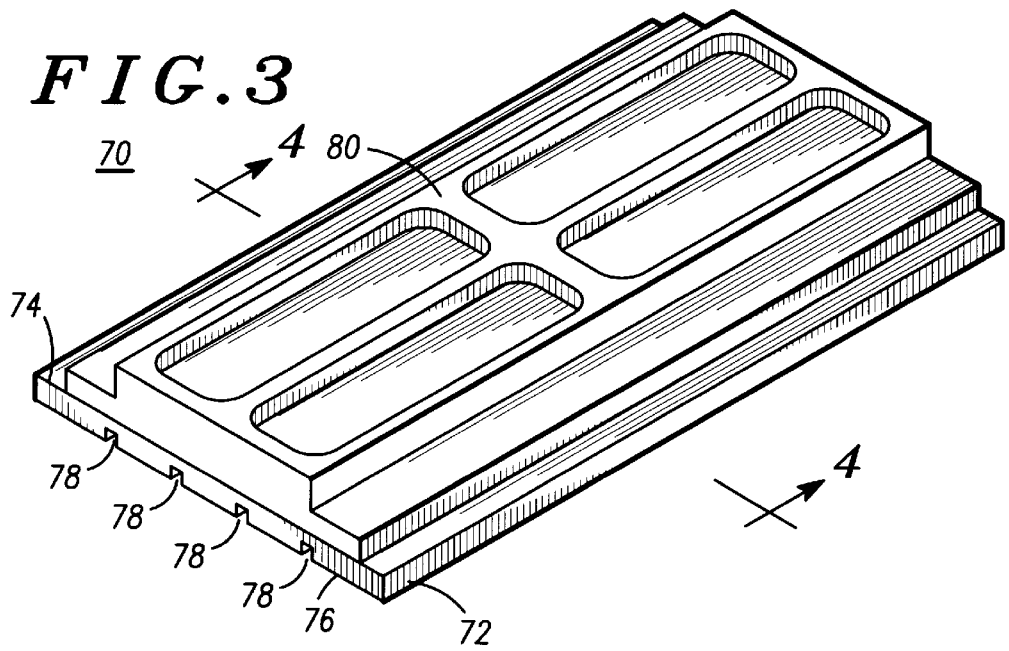

APPARATUS FOR SPRAY-COOLING MULTIPLE ELECTRONIC MODULES

FIELD OF THE INVENTION

This invention relates generally to the cooling of electronic heat sources, and, more particularly, to an apparatus for spray-cooling multiple electronic modules.

BACKGROUND OF THE INVENTION

Heat-generating electronic modules such as printed circuit boards (PCBs), multi-chip modules (MCMs), electronic hybrid assemblies including power amplifiers and passive components such as filters are frequently placed together in a rack-type housing such as a Versa Module Europe (VME) cage or an Electronic Industries Association (EIA) sub-rack.

Typically, commonly housed electronic modules are cooled by natural or forced air convection which, because of relatively poor thermal capacitance and heat transfer coefficients, requires moving large volumes of air through the housing and also requires wide spacing between the modules. Consequently, air-cooled housings are overly large, and the air cooling process itself introduces undesired acoustic noise and contaminants such as dust into the housing. In addition, air cooled housings are heavy because of heat spreading devices such as heat-sinks.

Evaporative spray cooling, described in U.S. Pat. No. 5,220,804 to Tilton et al., features the spraying of atomized liquid droplets directly onto a surface of a heat-producing device such as an electronic module. When the liquid droplets impinge upon the module's surface, a thin liquid film coats the module, and heat is removed primarily by evaporation of the liquid from the module's surface.

Although evaporative spray cooling is a preferred method of heat removal in many electronics applications, known spray cooling systems are not specifically designed to simultaneously cool several commonly housed electronic modules.

There is therefore a need for a compact apparatus for spray-cooling a number of electronic modules simultaneously.

SUMMARY OF THE INVENTION

According to an aspect of the present invention, the foregoing problems are ameliorated by an apparatus for spray-cooling multiple electronic modules which includes a chassis defining a chamber. The chassis has a first wall and a second wall opposed to the first wall. The first and second walls each have an interior side and an exterior side. A first plurality of guides are integrally formed in the interior side of the first wall and a second plurality of guides are integrally formed in the interior side of the second wall. One of each of the first plurality of guides is in substantial alignment with one of each of the second plurality of guides, to secure the electronic modules therebetween. A plurality of substantially planar fluid distributing manifolds are integrally formed in the first wall, each fluid distributing manifold having a surface recessed relative to at least a portion of the exterior side of the first wall. A plurality of nozzles are integrally formed in the surface of each fluid distributing manifold. Each nozzle has a receptacle end and a spray end. The spray end has an aperture and is in communication with the interior side of the first wall. The receptacle end is in communication with the surface of one of the plurality of fluid distributing manifolds. The receptacle end of each nozzle receives a fluid from one of the plurality of fluid distributing manifolds, the spray end of each nozzle atomizes the fluid and discharges the atomized fluid through the aperture.

According to another aspect of the present invention, an apparatus for spray-cooling multiple electronic modules includes a substantially planar plate having a first side and a second side. A plurality of substantially planar fluid distributing manifolds are formed in the first side of the plate, each fluid distributing manifold having a surface recessed relative to at least a portion of the first side of the plate. A nozzle housing is located in the surface of each fluid distributing manifold. The nozzle housing is adapted to receive a nozzle and has a receptacle end and a spray end. The spray end has an aperture, and the receptacle end is in communication with the surface of one of the plurality of fluid distributing manifolds. The spray end is in communication with the second side of the plate.

According to a further aspect of the present invention, a method for spray-cooling multiple electronic modules includes providing a substantially planar plate having a first side and a second side. The second side of the plate has a plurality of guides integrally formed therein. Each of the plurality of guides is sized to receive an electronic module. Next, a fluid is supplied to a plurality of substantially planar fluid distributing manifolds formed in the first side of the plate, each fluid distributing manifold having a surface recessed relative to at least a portion of the first side of the plate. The fluid is then received by a nozzle located in the recessed surface of each fluid distributing manifold, the nozzle having a spray end and an aperture. Finally, the fluid is atomized by the spray end of the nozzle and the atomized fluid is discharged through the aperture of the nozzle.

Advantages of the present invention will become readily apparent to those skilled in the art from the following description of the preferred embodiment of the invention which has been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 2 is a front view of the apparatus illustrated in FIG. 1 during normal operation.

FIG. 3 is a perspective view of an apparatus for spray-cooling multiple electronic modules according to a second embodiment of the present invention.

Detailed Description of the Preferred Embodiments

Figure 1:
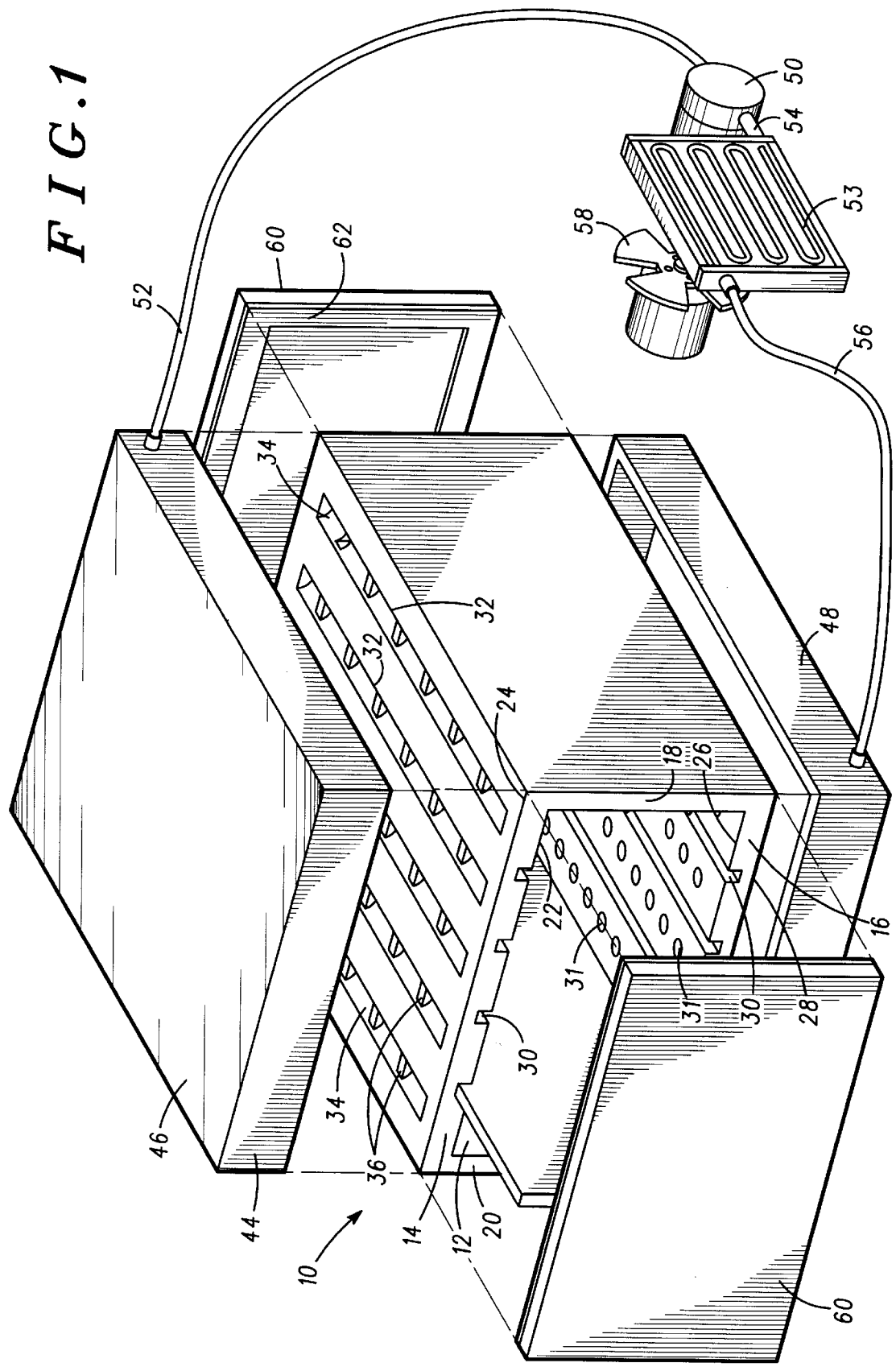
FIG. 1 is a perspective view of an apparatus for spray-cooling multiple electronic modules according to a first embodiment of the present invention.

Turning now to the drawings, wherein like numerals designate like components, FIG. 1 is a perspective view of an apparatus for spray-cooling multiple electronic modules according to a first embodiment of the present invention. As shown, chassis 10 defines a rectangular chamber 12 of any desired size having four walls 14, 16, 18 and 20. Chassis 10 may be any desired shape, however, and may be constructed of any suitable material, for example plastic or a metal such as aluminum. Chassis 10 may also be partitioned to create multiple chambers.

Top wall 14 has two sides, an interior side 22 and an exterior side 24. Top wall 14 opposes bottom wall 16, which also has two sides, an interior side 26 and an exterior side 28. A number of orifices 31 are located in bottom wall 16.

A number of guides 30 are integrally formed in interior side 22 of top wall 14 and in interior side 26 of bottom wall 16. Each guide 30 on top wall 14 is in substantial alignment with a guide 30 on bottom wall 16, so that electronic modules (shown in FIG. 2) may be secured between the pairs of guides 30. For example, electronic modules such as printed circuit boards (PCBs), passive components such as filters, multi-chip modules (MCMs) and electronic hybrid assemblies such as power amplifiers may be received by pairs of guides 30. Guides 30 may also provide electrical interconnection for electronic modules.

Fluid distributing manifolds 32 are integrally formed in top wall 14, approximately midway between guides 30. Each fluid distributing manifold 32 includes a recessed surface 34 on exterior side 24 of top wall 14. Recessed surface 34 may be, for example, a groove. Fluid distributing manifolds 32 may have any cross-sectional shape. A conical, rectangular or circular cross-sectional shape is preferred.

A number of nozzles 36 are integrally formed in recessed surface 34 of each fluid distributing manifold 32. As an example, twenty nozzles per manifold 32 may be provided. Nozzles 36 may be perpendicular to recessed surface 34, or may be at a slight angle to recessed surface 34.

Nozzle 36 is preferably a miniature atomizer such as a simplex pressure-swirl atomizer, which is approximately 0.3 mm high. Simplex pressure-swirl atomizers are described in detail in U.S. Pat. No. 5,220,804 to Tilton et al, and are commercially available from Isothermal Systems Research, Inc., located in Colton, Wash.

Referring again to FIG. 1 fluid distributing manifolds 32 supply a coolant (discussed in connection with FIG. 2) to nozzle 36 which atomizes and then discharges the coolant. The cooling fluid is preferably Fluorinert™, perfluorocarbon fluid available from 3M, order number FC-72, but may be another suitable dielectric coolant, such liquids being well-known and widely available. For example, a perfluorocarbon liquid similar to Fluorinert™ is available from Ausimont Galden®.

FIG. 2 illustrates normal operation of the embodiment of the spray-cooling system depicted in FIG. 1. Atomized fluid 43 is sprayed parallel to electronic modules 45 by nozzles 36 (shown in FIG. 1). A module having a power density of up to thirty Watts per centimeter squared is effectively cooled by this spray cooling system. The removal of heat directly from individual components helps to reduce operating temperatures of the modules 45 and their associated components, increasing reliability through elimination of thermal variation and associated thermal stresses. In addition, spacing constraints between electronic modules 45 are eliminated—modules may be placed as close together as the heights of components (not shown) attached to the modules will allow.

Referring again to FIG. 1, a fluid supply manifold 44 defining a reservoir 46 may be attached and sealed to exterior side 24 of top wall 14. Fluid supply manifold 44 supplies coolant to fluid distributing manifolds 32.

Likewise, a fluid discharge manifold 48 may be attached and sealed to exterior side 28 of bottom wall 16. Fluid discharge manifold 48 collects the coolant removed from chassis 10 via orifices 31.

It is contemplated that wherever sealing may be required, numerous methods and materials may be used. For example, in lieu of or in addition to compliant gaskets and fasteners, ultrasonic welding, brazing, soldering or swaging may be utilized.

As shown in FIG. 1, a fluid pump 50, which may be connected to fluid supply manifold 44 via tube 52, supplies a coolant to fluid supply manifold 44. A condenser 53, connected to pump 50 by tube 54 and to fluid discharge manifold 48 by tube 56, receives the fluid from fluid discharge manifold 48, rejects the heat from the fluid, optionally providing cooling via fan 58, and supplies cooled fluid to fluid supply manifold 44. Thus, a closed-loop flow of coolant is formed. It will be appreciated that at any given time the coolant may be a vapor, a liquid or a vapor and liquid mixture.

It is contemplated that any conventional means for providing flow of a coolant may be used in conjunction with the described embodiments of the present invention, and that more than one chassis 10 may be connected to a single source of coolant or that one or more sources of coolant may be connected to a single chassis 10. Alternatively, one or more closed loop fluid flow systems may be housed in chassis 10, in a partitioned chamber, for example.

The size of fluid pump 50, condenser 52 and fan 58 should be selected based on heat removal and flow rate requirements. For example, a typical closed loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

End plates 60, either or both of which may form a backplane to provide electrical connections for electronic modules 45 (shown in FIG. 2), may be sealed to chassis 10 by any suitable means. As shown, gasket 62, which is fastened between end plate 60 and chassis 10, serves as a sealant. At least one end plate 60 may also be integrally formed with chassis 10.

The closed loop fluid flow system described herein has many advantages. For example, it does not require routing and managing a multitude of fluid supply and discharge lines nor does it involve positioning and re-positioning spray nozzles to cool different types of modules. Consequently, as circuits are further integrated and physical space on and between electronic modules in rack-type housings is reduced, the spray cooling assembly described herein will not increase in size, weight or complexity.

The simplicity of the system also enhances its serviceability. For example, repairing the spray cooling assembly does not involve disconnecting and re-positioning numerous fluid lines, so that leakage potential of the system is decreased. Likewise, the system design provides for unobstructed access to individual electronic modules, facilitating removal and replacement of the modules.

FIG. 3 is a perspective view of an apparatus 70 for spray-cooling multiple electronic modules according to a second embodiment of the present invention. Apparatus 70 includes a plate 72, which may be constructed of a metal such as aluminum or another suitable material. Plate 72 has a top side 74 and a bottom side 76. As shown, plate 72 is approximately 220 mm long, 127 mm wide and 6.5 mm thick.

A number of guides 78 are integrally formed in bottom side 76 of plate 72. Guides 78 are used to position electronic modules (not shown), and as shown are approximately 3.5 mm wide.

A fluid supply manifold 80 may be in sealed communication with top side 74 of plate 72. As depicted, fluid supply manifold 80 is approximately 13.5 mm deep and supplies a coolant (not shown) at a flow rate of approximately 1000 milliliters per minute to apparatus 70. It is contemplated that apparatus 70 may be attached in any suitable manner to a chassis for housing electronic modules and that the same or similar means for providing a closed loop flow of coolant may be used in conjunction with the second embodiment of the present invention as was described in connection with the first embodiment.

Figure 4:
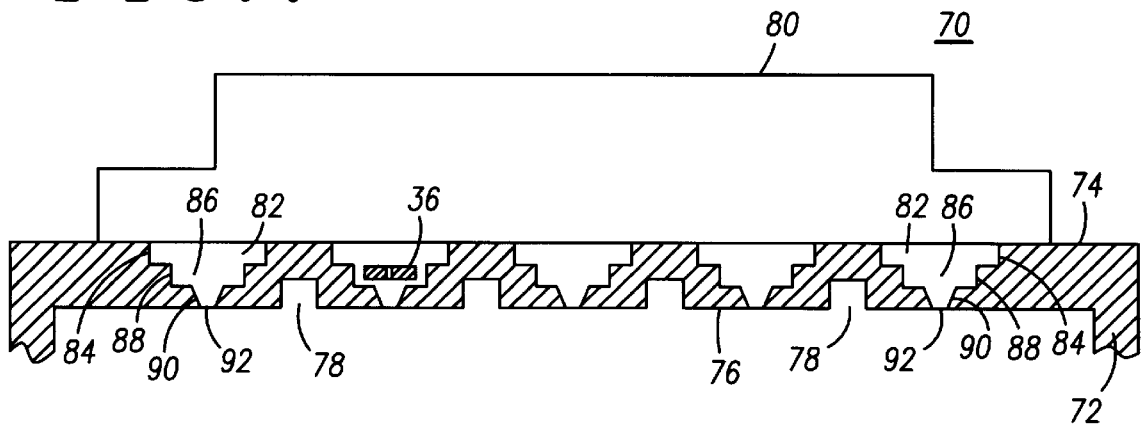
FIG. 4 is a front view of the apparatus for spray-cooling multiple electronic modules shown in FIG. 3.

As shown in FIG. 4, a front view of apparatus 70 shown in FIG. 3, plate 72 includes substantially planar fluid distributing manifolds 82 integrally formed in top side 74 of plate 72. Each fluid distributing manifold 82 has a recessed surface 84 in top side 74 of plate 72.

One or more nozzle housings 86 are formed in recessed surface 84 of each fluid distributing manifold 82. A nozzle housing 86 has a receptacle end 88 which is located on a recessed surface 84 of a fluid distributing manifold 82. A spray end 90 of nozzle housing 86 is in communication with bottom side 76 of plate 72, and includes an aperture 92, on the order of 0.15 mm in diameter. Each nozzle housing 86 is adapted to receive a nozzle 36 which may be made of any suitable material. An example of a suitable material is a metallic material such as brass. It is contemplated that nozzles are secured to nozzle housing 86 by, for example, press-fitting, soldering or bonding. Alternatively, nozzles may be integrally formed in each fluid distributing manifold 82. It will be understood that when a nozzle 36 is disposed in a nozzle housing 86, then nozzle 36, like nozzle housing 86, maybe referred to as having a receptacle end 88, a spray end 90 and an aperture 92.

Figure 5:
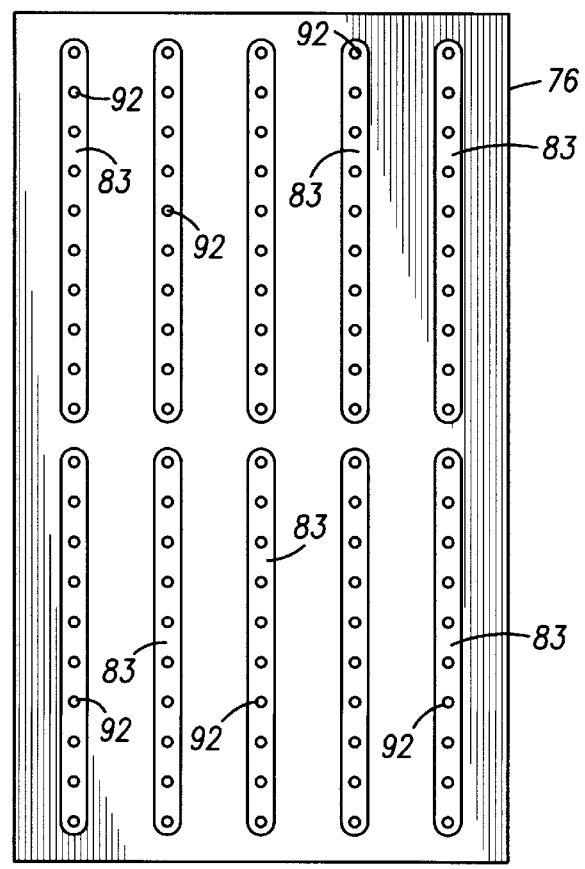
FIG. 5 is a bottom view of the apparatus illustrated in FIG. 4.

FIG. 5 is a bottom view of the apparatus illustrated in FIG. 3. As shown, apertures 92 are in communication with bottom side 76 of plate 72 (shown in FIGS. 3 and 4). Bottom surfaces 83 of fluid distributing manifolds 82 are also located on bottom side 76 of plate 72. As shown, one hundred apertures 92 corresponding to one hundred nozzles are divided evenly between five fluid distributing manifolds 82 (shown in FIG. 4), so that each manifold 82 houses twenty nozzles. As illustrated in FIGS. 3 and 4, this nozzle arrangement cools four electronic modules secured by guides 78.

The embodiment of the spray-cooling system depicted in FIGS. 3–5 shares the heat-removal and packaging advantages realized by the spray cooling apparatus depicted in FIG. 1. Thus, spacing between electrical components is governed by maximum component height, not by the requirements of the cooling system. In addition, plate 72 is compact and portable. Thus, assembly is efficient, serviceability and replacement are simplified, and precise heat source-to-nozzle registration may be obtained.

It will be understood that while the embodiments described show electronic modules being cooled during normal operation, the present invention is not limited only to cooling during ordinary operation of the electronic modules, but may be adapted to, for example, testing and evaluation of the electronic modules or the electronic circuit devices included in the modules.

It will also be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for spray-cooling multiple electronic modules, the apparatus comprising:
    a chassis defining a chamber, the chassis having a first wall and a second wall opposed to the first wall, the first wall having an interior side and an exterior side and the second wall having an interior side and an exterior side;
    a first plurality of guides integrally formed in the interior side of the first wall;
    a second plurality of guides integrally formed in the interior side of the second wall, one of each of the first plurality of guides being in substantial alignment with one of each of the second plurality of guides, to secure the electronic modules therebetween;
    a plurality of substantially planar fluid distributing manifolds integrally formed in the first wall, each fluid distributing manifold having a surface recessed relative to at least a portion of the exterior side of the first wall; and
    a plurality of nozzles integrally formed in the surface of each fluid distributing manifold, each nozzle having a receptacle end and a spray end, the spray end having an aperture, the receptacle end being in communication with the surface of one of the plurality of fluid distributing manifolds and the spray end being in communication with the interior side of the first wall,
    the receptacle end of each nozzle receiving a fluid from one of the plurality of fluid distributing manifolds, the spray end of each nozzle atomizing the fluid and discharging the atomized fluid through the aperture.

2. The apparatus according to claim 1, further comprising an electronic module, the electronic module secured between one of the first plurality of guides and one of the second plurality of guides.

3. The apparatus according to claim 2, wherein the electronic module comprises a passive component.

4. The apparatus according to claim 2, wherein the electronic module comprises a multi-chip module.

5. The apparatus according to claim 2, wherein the electronic module comprises an electronic hybrid assembly.

6. The apparatus according to claim 1, wherein the second wall has a plurality of orifices.

7. The apparatus according to claim 6, further comprising:
    a fluid supply manifold in communication with the exterior side of the first wall, the fluid supply manifold defining a reservoir, the reservoir supplying the fluid to the plurality of fluid distributing manifolds; and
    a fluid discharge manifold in communication with the exterior side of the second wall, the fluid discharge manifold collecting the fluid removed by the plurality of orifices.

8. The apparatus according to claim 7, further comprising:
    a fluid pump in fluid communication with the fluid supply manifold; and
    a condenser in fluid communication with the fluid pump and with the fluid discharge manifold;
    the condenser receiving the fluid from the fluid discharge manifold and supplying the fluid to the fluid pump, the fluid pump supplying the fluid to the fluid supply manifold, forming a closed loop fluid supply system.

9. The apparatus according to claim 1, further comprising:
    an end plate in communication with the chassis.

10. The apparatus according to claim 1, wherein the chassis comprises plastic.

11. The apparatus according to claim 1, wherein the fluid comprises a perfluorocarbon fluid.

12. The apparatus according to claim 1, wherein the spray end of each of the plurality of nozzles is substantially perpendicular to at least a portion of the surface of each of the plurality of fluid distributing manifolds.

13. The apparatus according to claim 1, wherein the surface of each of the plurality of fluid distributing manifolds comprises a groove.

14. An apparatus for spray-cooling multiple electronic modules, the apparatus comprising:

a substantially planar plate having a first side and a second side;

a plurality of substantially planar fluid distributing manifolds formed in the first side of the plate, each fluid distributing manifold having a surface recessed relative to at least a portion of the first side of the plate;

a plurality of guides integrally formed in the second side of the plate sized to receive the electronic modules; and a nozzle housing in the surface of each fluid distributing manifold, the nozzle housing adapted to receive a nozzle and having a receptacle end and a spray end, the spray end having an aperture, the receptacle end being in communication with the surface of one of the plurality of fluid distributing manifolds and the spray end being in communication with the second side of the plate.

15. The apparatus according to claim 14, further comprising a nozzle, the nozzle disposed in the nozzle housing, wherein the nozzle is press-fit into the nozzle housing.

16. The apparatus according to claim 15, wherein the nozzle is soldered into the nozzle housing.

17. The apparatus according to claim 15, wherein the nozzle comprises brass.

18. The apparatus according to claim 14, wherein the plate comprises aluminum.

19. The apparatus according to claim 14, wherein the surface of each of the plurality of fluid distributing manifolds comprises a groove.

20. The apparatus according to claim 14, further comprising:

a fluid supply manifold in sealed communication with the first side of the plate, the fluid supply manifold supplying a fluid to the plurality of fluid distributing manifolds.

21. A method for spray-cooling multiple electronic modules, the method comprising:

providing a substantially planar plate having a first side and a second side, the second side having a plurality of guides integrally formed therein, each of the plurality of guides sized to receive an electronic module;

supplying a fluid to a plurality of substantially planar fluid distributing manifolds formed in the first side of the plate, each fluid distributing manifold having a surface recessed relative to at least a portion of the first side of the plate;

receiving the fluid by a nozzle located in the surface of each fluid distributing manifold, the nozzle having a spray end and an aperture;

atomizing the fluid by the spray end of the nozzle; and discharging the atomized fluid through the aperture of the nozzle.

* * * * *